US009429919B2

(12) United States Patent
Schimper

(10) Patent No.: US 9,429,919 B2
(45) Date of Patent: Aug. 30, 2016

(54) LOW POWER BIPOLAR 360 DEGREES TIME TO DIGITAL CONVERTER

(71) Applicant: Intel Deutschland GmbH, Neubiberg (DE)

(72) Inventor: Markus Schimper, Moosinning (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 14/542,802

(22) Filed: Nov. 17, 2014

(65) Prior Publication Data

US 2016/0139568 A1     May 19, 2016

(51) Int. Cl.
  *G04F 10/00* (2006.01)
  *H03M 1/00* (2006.01)
  *H03M 1/08* (2006.01)
  *H03L 7/099* (2006.01)

(52) U.S. Cl.
  CPC ............ *G04F 10/005* (2013.01); *H03L 7/0991* (2013.01); *H03M 1/002* (2013.01); *H03M 1/0836* (2013.01)

(58) Field of Classification Search
  CPC .............. G04F 10/005; H03L 2207/50; H03L 7/0802; H03L 7/0991; H03M 1/002; H03M 1/0836
  USPC ......................................... 375/295, 296, 376
  See application file for complete search history.

(56) References Cited

U.S. PATENT DOCUMENTS

| | | | |
|---|---|---|---|
| 8,174,293 B2 * | 5/2012 | Yoshihara | ............. G04F 10/005 327/107 |
| 2001/0015666 A1 | 8/2001 | Noda et al. | |
| 2009/0219073 A1 | 9/2009 | Sun et al. | |
| 2010/0244971 A1 * | 9/2010 | Wang | .................... G04F 10/005 331/1 A |
| 2011/0109356 A1 | 5/2011 | Ali et al. | |
| 2012/0161831 A1 | 6/2012 | Ravi et al. | |
| 2013/0147531 A1 * | 6/2013 | Lee | ......................... H03L 7/085 327/158 |
| 2014/0055181 A1 * | 2/2014 | Chaivipas | ................ H03K 5/26 327/156 |
| 2014/0091866 A1 | 4/2014 | Schimper | |

FOREIGN PATENT DOCUMENTS

WO     2007/093221 A1     8/2007

OTHER PUBLICATIONS

Zanuso et al., Time-to-Digital Converter with 3-ps Resolution and Digital Linearization Algorithm, Proceedings of the ESSCIRC, Sep. 2010.*
Straayer, et al. "A Multi-Path Gated Ring Oscillator TDC With First-Order Noise Shaping." IEEE Journal of Solid-State Circuits, vol. 44, No. 4, Apr. 2009.
Zanuso, et al. "Time-to-Digital Converter with 3-ps Resolution and Digital Linearization Algorithm." Proceedings of the ESSCIRC, Sep. 2010.
European Search Report Dated Jun. 29, 2016, Application No. 15190054.5-1559/3021176.

\* cited by examiner

*Primary Examiner* — Freshteh N Aghdam
(74) *Attorney, Agent, or Firm* — Eschweiler & Associates, LLC

(57) ABSTRACT

A delay line operates to propagate a plurality of delay stages comprising a first delay element and a second delay element. A generator coupled to the delay line is configured to provide the start edge to the plurality of delay stages of the delay line as a function of a digital control oscillator (DCO) counter value generated by a DCO counter. A DCO calculation component is configured to facilitate a determination of propagation counts of the delay line as a function of DCO periods of a DCO.

20 Claims, 9 Drawing Sheets

LOW POWER BIPOLAR 360 DEGREES TIME TO DIGITAL CONVERTER

BACKGROUND

Phase-locked loops (PLLs) can provide precise generation and alignment of timing for a wide variety of applications. Digital phase-locked loops (DPLLs) are a viable alternative to traditional PLLs, in which a digital loop filter can be utilized to replace analog components. Further, time to digital converters (TDCs) can operate to digitally encode a phase error between reference and divider outputs. In ring oscillator based TDCs, power consumption and phase noise increase with measured time. The measure time of all digital phase locked loops (ADPLLs) is thus kept as small as possible to avoid power consumption and phase noise penalty. Because TDCs typically measure positive times, an additional TDC offset is normally introduced in front of a digital loop filter of the ADPLL, in which the TDC offset is chosen to give a margin for a multi-modulus divider (MMD) induced edge variation. A need exits therefore to overcome measure time induced power and phase noise penalty, while pursuing high resolution and high linearity in the TDC time-to-digital mapping characteristic with low power and low area in the implementation.

DETAILED DESCRIPTION

Figure 1:
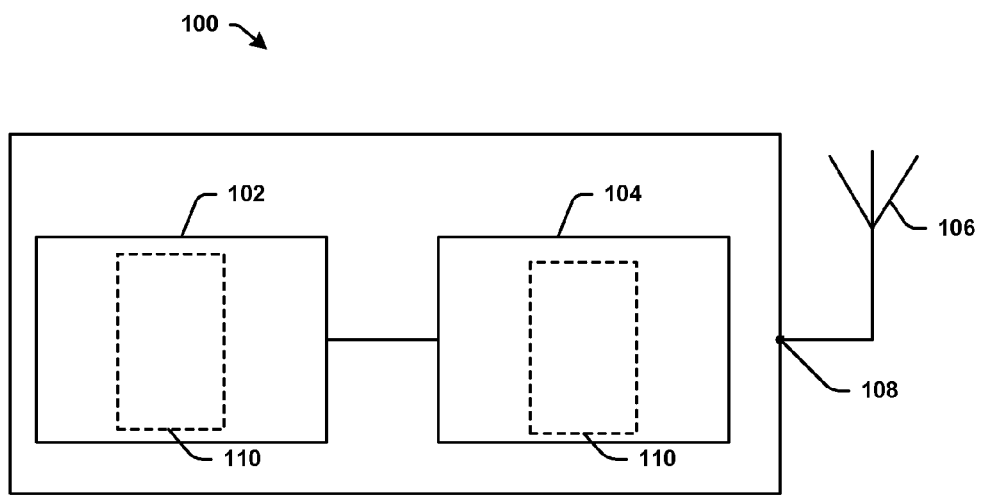
FIG. 1 illustrates an exemplary mobile communication device comprising at least an exemplary differential delay line.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for TDCs are disclosed, which avoid having to digitally introduce a TDC offset in front of the PLL loop filter by facilitating bipolar time measurement techniques. This TDC offset normally operates to counteract the capability of TDCs to measure positive time differences only. However, the TDC offsets can be eliminated by systems and methods provided herein, which can be implemented in various components and systems, such as frequency modulated ADPLLs applicable in polar-modulators. In one embodiment, a digital oscillator (such as the oscillator of the DPLL employing the TDC) is utilized for determining a coarse time measurement/quantization that biases a phase locked loop before being locked in a frequency of operation (e.g., the reference frequency being synchronized to a feedback or divider frequency) by a fine tuning/timing measurement. A digital control oscillator calculation component is configured to calculate the coarse time measurement or a coarse tuning measurement from counted digital oscillator edges, even when the digital oscillator frequencies being received have been modulated (e.g., a polar frequency modulator or the like modulator). The low frequency part of a modulator (e.g., fractional sample rate converter of the modulator) can be used to calculate the coarse time measurements. An edge selector, a phase generator and a delay line can generate a bipolar time measurement (e.g., a sign value) for the fine tuning/timing measurement and generate a cancellation of an offset that depends on a process, a voltage or a temperature variance with respect to use, time or change of the system. Rather than having two or more linear TDCs for a positive measuring and a negative measuring of times and a fixed clock frequency, systems disclosed herein can operate as a bipolar time measuring single TDC with a single delay line that also facilitates a generation of bipolar time measurements, which indicate or represent different polarities based on a timing of a reception of a received reference signal edge or a received feedback/divider signal edge. In addition, the systems disclosed can determine the bipolar time measurement with modulated frequencies. Additional aspects and details of the disclosure are further described below with reference to the figures.

Referring to FIG. 1, illustrated is an example mobile communication device 100 that can operate in accordance with various aspects being disclosed. The mobile communication device 100, for example, comprises a digital baseband processor 102, an RF frontend 104 and an antenna port 108 for connecting to an antenna 106. The mobile communication device 100 can comprise an exemplary TDC 110 as part of the digital baseband processor 102 or the RF frontend 104, which can also operate as a component within a DPLL for example. Nevertheless, it is also possible that each of the digital baseband processor 102 and the RF frontend 104 comprises such a TDC 110 or even comprises more than one of such TDC 110. The RF frontend 104 is coupled to the digital baseband processor 102 and the antenna port 108.

The TDC 110 can operate with a differential delay component that ensures there is no delay mismatch between a positive and negative input and output of the differential delay chain. In TDC topologies disclosed herein, the digital controlled oscillator (DCO) circulation counter can be used to determine a coarse time quantization or a coarse time measurement for coarse tuning without use of additional multiplexers for propagation or circulation counting. These advantages lead to a better phase noise performance, a symmetrical clock generation and a reduction in quantization noise. The quantization noise can be reduced when the TDC 110 is used with a differential delay line of the mobile communication device 100, which can operate to replace circulation or propagation counting by using the DCO for determining coarse time quantization. For example, the coarse quantization time can be calculated by the sum of the DCO periods of the DCO.

Further, the TDC 110 achieves a resolution enhancement, for example, when the TDC 110 is used for measuring time between certain events. Hence, the TDC 110 enables a more precise generation of clock signals in the mobile communication device 100 and a more precise measuring of time differences (such as in a DPLL). The improved generation of clock signals and improved measuring of time differences enables a reduction of a noise floor in the mobile communication device 100 and therefore improves or facilitates the overall performance of the mobile communication device 100.

Figure 2:
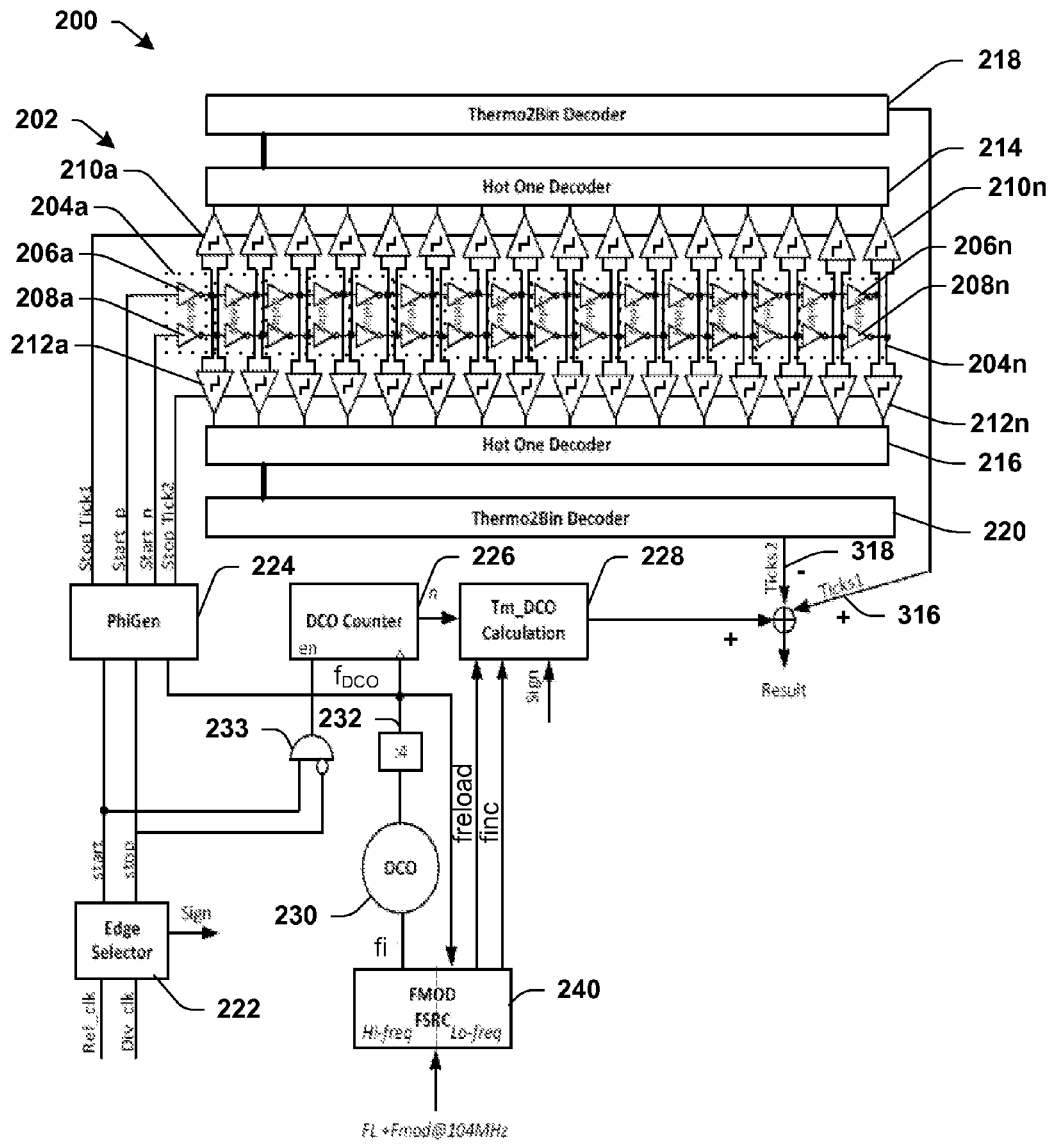
FIG. 2 illustrates an exemplary time to digital converter (TDC) in accordance with various aspects described.

Referring now to FIG. 2, illustrated is an exemplary implementation of a TDC 200 as a fully differential multipath low-power bipolar delay line TDC in accordance with various aspects described. The TDC 200 comprises a differential delay line 202 that operates to propagate a signal edge via differential delay stages 204a to 204n to facilitate measuring of times between at least two edges of the same or different signals. In one example, the time difference representing a phase error between a reference signal and a feedback signal in a DPLL is measured by the TDC 200. Although a differential delay line is contemplated, a single ended delay could also be embodied as the delay line.

In one example configuration of the delay line 202, the delay stages 204a to 204n each include a first delay element 206a to 206n and a second delay element 208a to 208n, which can represent one or more elements for each stage, such as for a differential chain of delay elements 206a to 206n or for 208a to 208n, for example. The first delay elements 206a to 206n can be connected in series to form a first positive delay chain (e.g., a positive delay chain) of the differential delay line 202, while the second delay elements 208a to 208n can be connected in series to form a second negative delay chain (e.g., a negative delay chain) of the differential delay line 202. For example, the delay elements of the differential delay line 202 can comprise differential delay elements with a positive and a negative delay line or path that can be cross coupled at a positive input and a negative input of each delay element, in which the differential delay elements of the chains are free, independent of or without any mismatch. As such, each of the delays elements can be synchronized.

In another example configuration, the differential delay line 202 can comprise a first plurality of comparators 210a to 210n, inputs of which are connected to the outputs of the first delay elements 206a to 206n. The differential delay line 202 comprises a second plurality of comparators 212a to 212n and can be implemented to propagate signal edges without additional multiplexers. In detail, the differential delay line 202 comprises per delay stage an associated comparator 210a to 210n and 212a to 212n, a first input of which can be connected to an output of one of the delay elements of the associated delay stage 204a to 204n and a second input of which is connected to the other delay element of the associated delay stage 204a to 204n, as such each comparator can have a positive and negative input Alternatively or additionally, in another example of the differential delay line 202, inputs of every second comparator may be complementarily connected to the outputs of the associated delay stage with the inputs of the comparators associated to the preceding delay stage. As an example, a first input of a first comparator could be connected to the output of the first delay element of the first delay stage and a second input of the first comparator would be connected to the output of the second delay element of the first delay stage. According to the principle mentioned above, for a comparator being associated to a delay stage directly succeeding the first delay stage, the first input of this comparator could be connected to the output of the second delay element of the preceding delay stage and the second input of the comparator would be connected to the output of the first delay element of the preceding delay stage.

The differential delay line 202 is configured to measure time differences such as a time between the insertion of the start edge and the occurrence of a stop signal, in which the insertion of the start and stop edges can be done directly into the line from a phase generator 224 without utilizing or independently of a multiplexer between the phase generator and the differential delay line 202. A complementary circuiting of the inputs of the comparators or the outputs of the comparators being associated to directly succeeding delay stages, as discussed in the above example configurations, can facilitate a hot one decoder 214, 216 to determine the position of the start edge in the differential delay line 202. The TDC 200 comprises a top hot one decoder 214 and a bottom hot one decoder 216, a top thermo to binary decoder 218 and a bottom thermo to binary decoder 220. Rather than the differential delay line 202 comprising additional multiplexers to count propagations or oscillations of a signal edge, the TDC 200 utilizes a DCO circulation counting for coarse time quantization and initiating the start and stop edges to the delay line via the phase generator 224. The TDC 200 thus avoids power hungry and phase noise degrading ring oscillator circulations for coarse time quantization and avoids circulation determinations from a top and bottom counter.

In one embodiment, the coarse quantization time $t_{m\_dco}$ can be determined as a function of the DCO periods of a DCO 230 coupled to the delay line 202 as in the following equation:

$$t_{m\_DCO} = \Sigma_1^i t_i \qquad \text{Eqn. 1,}$$

wherein $t_i$, is the period of the DCO 230 and i is the DCO counter value of a DCO counter 226, which can also be represented as (n) herein, as illustrated in FIG. 2.

The differential implementation of the TDC 200 can be used, for example, for an all-digital wireless PLL (ADPLL).

The time to digital converter 200 can operate to measure the time between the rising edge of the 26 MHz reference clock and the rising edge of a divider edge such as a multi modulus divider (MMD) edge.

An edge selector 222 can provide a start signal and a stop signal to the phase generator 224, which, in turn, generates a start edge and a stop edge into the differential delay line 202 in response to receiving the start signal and the stop signal. The edge selector 222 is therefore configured to compare a reference signal of a reference clock (Ref_clk) and a divider signal of a divider clock (Div_clk) and generate the start signal and the stop signal to a phase generator 224. In another aspect, the edge selector 222 generates a sign value (sign) to a coarse time calculation component (labelled $T_{m\_DCO}$ calculation) 228, in which the sign value is based on an order of receiving the reference signal and the divider signal as a bipolar time measurement, as further detailed below.

In the example shown in FIG. 2, the differential delay line 202 can comprise multiple different delay stages 204a to 204n with a unit delay, for example, of about 8 picoseconds or other delay. The differential delay line 202 comprises, for example, a sufficient number of delay elements to accommodate or handle a maximal DCO period divided by 2 or 4, for example, as represented by the division component 232. After starting the differential delay line 202, the start edge propagates at least partially through the differential delay stages 204a to 204n to an extent according to DCO edges of the DCO 230, such as a DCO rising edge or a DCO falling edge of the DCO 230. The polarity of the edge can change or reverse after each circulation or propagation through the differential delay line 202, which is also based on a rising or a falling DCO edge. In this manner, positive and negative determinations can come from a reuse of the same delay line that facilitates the offset cancelation. In addition, a bipolar measurement can be generated from the edge selector block 222, which is discussed further below, for further determining a coarse time quantization.

In the example of measuring the time between the rising edge a reference clock (e.g., 26 MHz) and the rising edge of a divider edge, the stop edge or stop signal is derived from a next rising DCO edge. The stop signal denoted as Stop_Ticks 1 and Stop_Ticks 2 from the phase generator 224 results from the edge selector 222 and is a function of a next rising edge of the DCO 230. The Stop Ticks 1 and Stop Ticks 2 signals trigger the comparators 210a to 210n and 212a to 212n to latch current states of the delay stages, for example. The hot one decoder 214 and 216 are configured to convert the comparator output (as Comp_Ticks 1, Comp_Ticks 2) that represents the latched current state as a thermometer code in a circulation independent hot one code. The two thermo to binary decoders 218, 220 are configured to convert the top and bottom 16 hot one decoder outputs of the hot one decoder 214 and 216 to a binary code, such as a 4-bit binary code.

Figure 3:
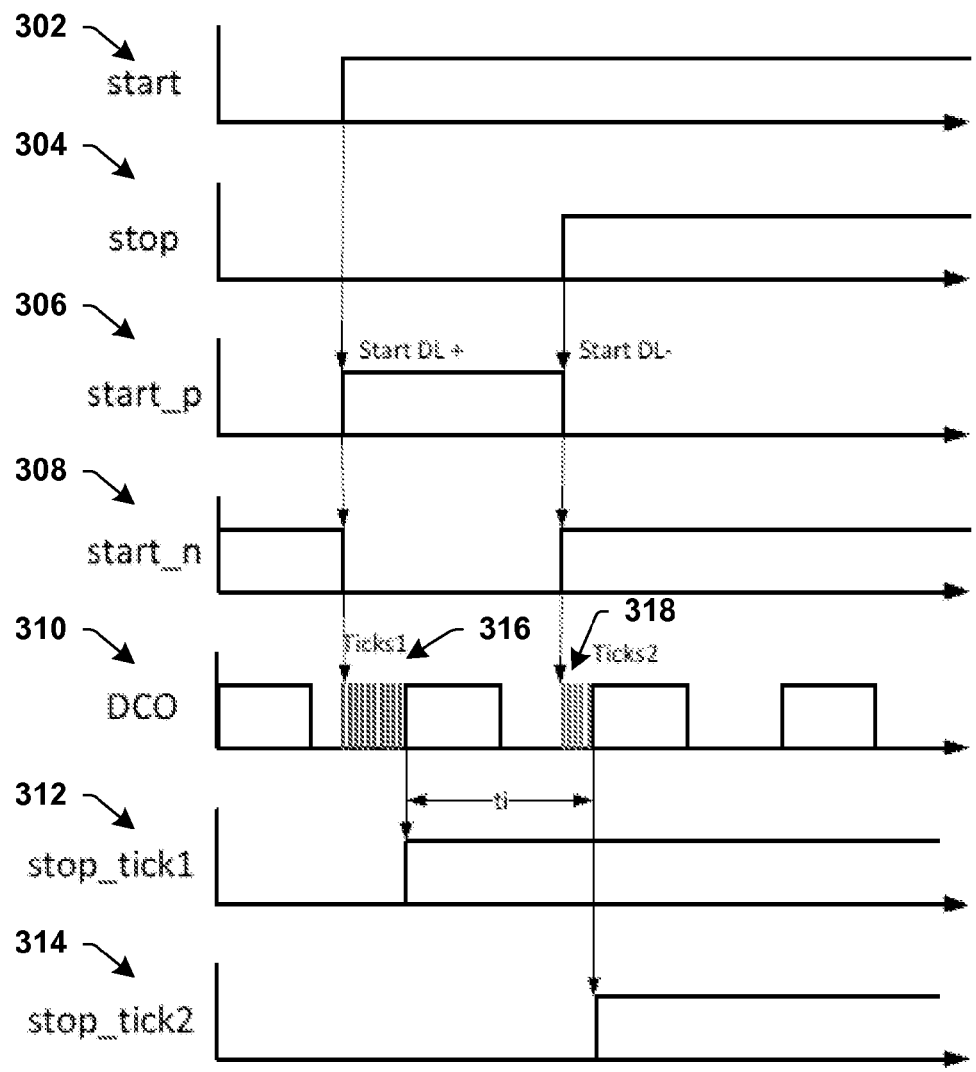
FIG. 3 illustrates timing operations of components of the TDC in accordance with various aspects described.

The phase generator 224 of the TDC 200 controls the propagating and latching of the delay stages 204a to 204n via a propagation mode and a latching mode as a function of a start and stop signal provided by the edge selector 222 and a DCO edge of the DCO 230. For example, as illustrated in FIG. 3, a start signal 302 is initiated by the edge selector 222 to the phase generator 224. As a result, the phase generator 224 converts the start signal 302 into a start_p signal 306 and a start_n signal 308 as a positive start_p edge and a negative start_n edge, for example. The positive differential edge propagates (Ticks 316) along the differential delay line 202 at the conversion of the start signal 302 to a start delay line plus (start DL+) until the first subsequent rising DCO edge latches the Delay Line states with the comparators 210a to 210n (Tick 1 comparators). The latching in a latch mode of the delay line 202 is initiated by first subsequent DCO edge after the positive start signal 306 initiates propagating, for example.

Figure 4:
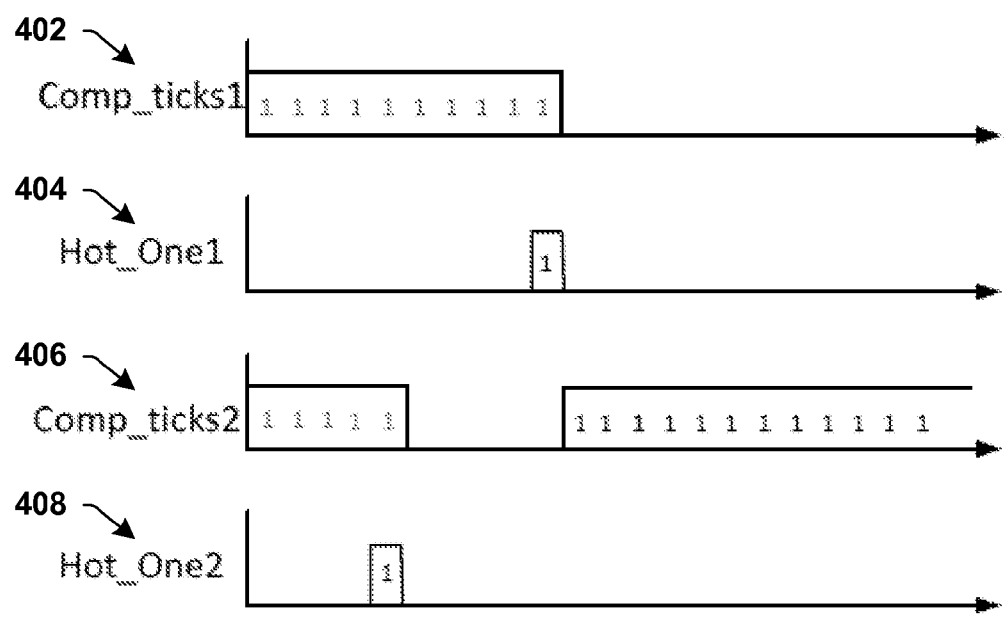
FIG. 4 illustrates operations and binary conversions of components of the TDC in accordance with various aspects described.

A conversion result 402 of the comparator latching is denoted as Comp_tick1 402, as illustrated in FIG. 4. The Hot One Decoder 214 converts the first Comp_tick1 402 (1/0) transition into a hot one code 404. The hot one code 404 is converted by the thermo to bin decoder 218 in a binary Ticks 1 value of the Ticks 1 propagation 316, as illustrated in FIG. 3.

Further, a rising stop edge 304 is received by the phase generator 224 from the edge selector 222. The phase generator 224 converts the stop signal 304 into a falling edge at the start signal 306 start_p and a rising edge at the start signal 308 start_n. This second differential edge (conversion of stop signal 304) has an opposite direction in comparison to the first differential edge (conversion of start signal 302) and propagates along the differential delay line 202 as shown at Ticks2 318 until the next rising DCO edge 310 initiates subsequent to the stop signal 304 facilitates a stop_Ticks2 signal 314, which causes a latching mode of the delay line 202 that operates to latch the delay line 202 state with the comparators 212a to 212n respectively (denoted also as corresponding Ticks2 comparators). The latch result, or the latched/locked state, is denoted as a binary signal 406 in FIG. 4 or as Comp_ticks2. As the Tick2 comparators 212a to 212n are in opposite direction in connection to the delay line 202, they are affected by the negative differential edge flipped delay-elements 208a to 208n, which appear positive in the Comp_Tick2 conversion result 406. Subsequent to the latching of Ticks2 318 by the DCO edge 310, the hot one decoder 216 converts the first Comp_tick2 (1/0) transition into the binary code 406, a Hot one code 1. The hot one code 406 is then converted by the thermo to bin decoder 220 into a binary Ticks2 value of the opposing Ticks 2 propagation 318.

The final time measurement (i.e., Result) can be represented as the final start/stop time $t_{start\_stop}$, which is calculated as a function of $t_{tm\_DCO}$, $t_{ticks1}$, $t_{ticks2}$ and $\Delta t$, wherein $\Delta t$ is the delay of one unity delay element 204a of delay elements 204a to 204n, or 208a to 208n. The unity delay time $\Delta t$ can be used to calculate $t_{ticks1}$=ticks1*$\Delta t$, and $t_{ticks2}$=ticks2*$\Delta t$, while ticks1 (Ticks1) and ticks2 (Ticks2) are the binary values from conversion. In one example, the $t_{start\_stop}$ is determined according to following:

$$t_{start\_stop} = t_{ticks1} - t_{ticks2} + t_{tm\_DCO}, \quad \text{(Eqn. 2)}.$$

In one aspect, the TDC 200 operates to determine the coarse quantization time of the delay line as a function of the digital controlled oscillator 230, which is represented by Eqn. 1 above. The counting of propagations of the delay line 202 is replaced by the DCO 230, the DCO counter 226 and a coarse time calculation component 228 for determining $t_{tm\_DCO}$. The advantage of such an architecture is that the circulation counting or propagation counting is performed without multiplexers being assigned to such functions. The propagation counting is determined independent of multiplexers. The final time measure or start and stop time $t_{start\_stop}$ of the delay line for latching and propagation modes and phase measurement is performed by the same delay line via measurements of Ticks1 and Ticks2, which is further a function of the same phase generator 224.

The below Eqn. 3 illustrates offset cancellation of the Result or final start stop time measurement as a result of the advantages of having the same delay line 202 for providing a binary conversion from the thermo to bin decoders 218 and 220 and phase determinations for the entire delay line via a single phase generator 224 as a function of the DCO 230 and DCO counter 224. This offset cancellation via the delay line 202 enables a linear offset free TDC, which can operate to measure positive times.

$$t_{start\_stop} = t_{ticks1} + t_{offset} - t_{ticks2} - t_{offset} + t_{m\_DCO} = t_{ticks1} - t_{ticks2} + t_{m\_DCO},$$ (Eqn. 3).

The edge selector 222 is configured to compare a reference clock and a divider clock. In response to the comparison, the edge selector 222 generates a start signal or a stop signal to the phase generator 224 and to a logic gate 233 to enable the DCO counter 226, as well as a bipolar time measurement as a sign value (sign) to the coarse time calculation component 228.

Figure 5:
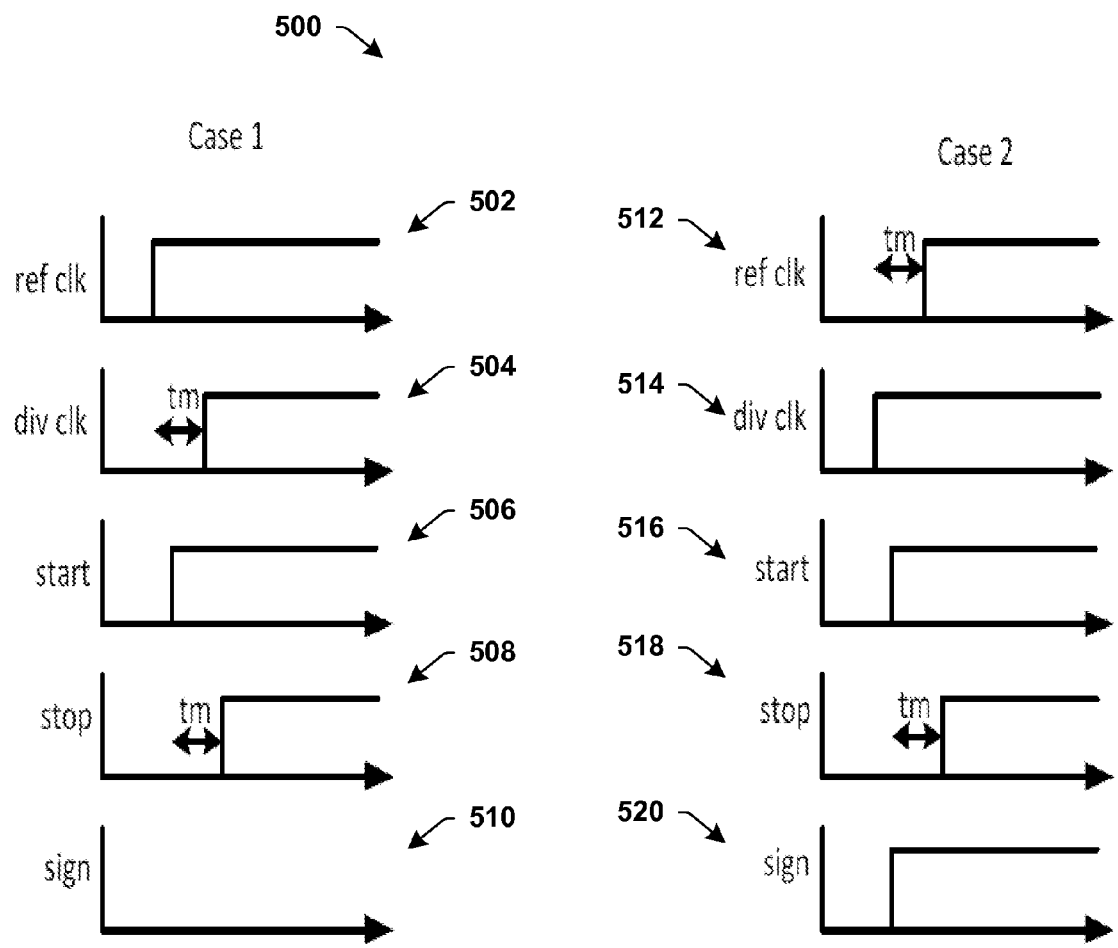
FIG. 5 illustrates timing operations of an edge selector component of the TDC in accordance with various aspects described.

For example, FIG. 5 illustrates timing diagrams 500 of the edge selector 222 of FIG. 2 for generating a sign value for the determination of the coarse time measurement via the coarse time calculation component 228. The edge selector 222 receives the reference clock input 502 or 512 and the divider clock input 504 or 514. In Case 1, the first rising edge on the reference clock 502 triggers the start signal 506, while in Case 2, the first rising edge being the divider clock 514 triggers the start signal 516. If the divider clock edge is earlier than the reference clock edge, as in Case 2 of divider clock edge 514 and reference clock edge 512, then the sign signal or sign value is one (e.g., sign signal 520). The sign signal 520 indicates that there is a negative time differential $t_m$ between the reference edge 512 and the divider edge 514 (i.e., the reference clock edge or ref clk edge trails the divider clock edge or div clk edge). Case 1 is a positive case, in which the reference clock edge 502 is earlier than the divider clock edge 504 (i.e., the ref clk edge leads the div clk edge), and thus a positive time differential $t_m$ and the sign signal 510 is generated as a negative output sign. The signals 510 and 520 could be reversed in meaning and other indications can also be provided to generate a bipolar time measurement for indicating a time differential and provided to the coarse time calculation component 228 for generating the coarse time measurement based on the sign value or sign signal The edge selector 222 further operates to convert the reference clock inputs 502 or 512 and the divider clock inputs 504 and 514 into start signals 506 or 516 respectively and stop signals 508 or 518, as well as determine a sign signal or sign value (sign) based on the receiving order of reception of the reference signal and the divider signal.

In one aspect, the TDC 200 can generate time measurements of different polarity for a bipolar time measurement and further cancel an offset that results from at least one of a process, a temperature and/or a voltage dependency. For example, a digital TDC gain calibration can be used (e.g., coarse time calculation component), to overcome the unity delay Δt process temperature voltage (PVT) dependency. Without compensating for the unity delay Δt PVT dependency, the gain of the TDC would vary and the TDC would be unable to match the DCO coarse time $t_{m\_dco}$ with the time measurements or bipolar measurement (e.g., Ticks 1 and Ticks 2) of the TDC, resulting in a mismatch therebetween. However, the delay line can be configured to cancel any intrinsic offset due to PVT variations with the unit delay time. In the digital gain calibration, the unity delay Δt can be determined by measuring two different DCO periods $t_1$ and $t_2$, with ticks1 and ticks2 according to equation (4) as follows:

$$\Delta t = \frac{t_2 - t_1}{ticks_2 - ticks_1}.$$ (Eqn. 4)

The time Δt is used to calculated $t_{start\_stop}$, such as via the coarse time calculation component 228, which is afterwards normalized with $\Delta t_{norm} = 2$ ps to $t_{norm}$ according to equation (5) as follows:

$$t_{norm} = \frac{t_{start\_stop}}{\Delta t_{norm}}.$$ (Eqn. 5)

Figure 6:
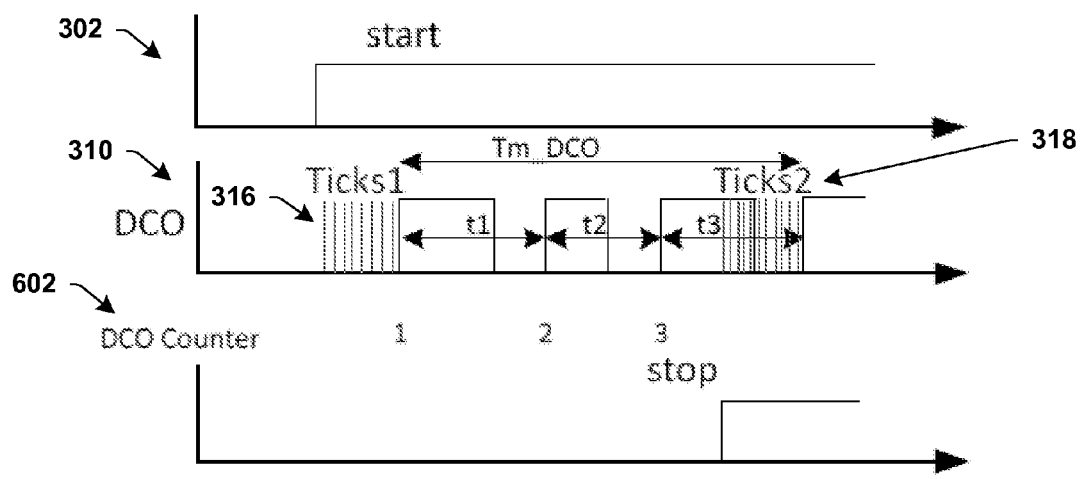
FIG. 6 illustrates timing operations of components of the TDC in accordance with various aspects described.

FIG. 6 illustrates various aspects of the DCO counter 226 of FIG. 2. As can be seen, when a start edge 302 is initiated by the edge selector 222, the edge is propagated through the delay line 202 until the first rising DCO edge of the DCO 230 latches the comparators 210a to 210n, a Ticks1 value 316 is determined and the DCO counter 226 counts the DCO periods according to the DCO edges. In response to a stop signal being initiated and the comparators 212a to 212n (depending on the period length) being latched concurrent to the propagation (e.g., a negative propagation or reverse propagation), the DCO counter 226 halts counting 602 and Ticks2 is determined. A delay line length can be determined by the DCO clock divided by 2 or 4 depending on the selected band, which lead to frequency range of 700 MHz up to 1500 MHz. As such, the delay line 202 handles up to 1.5 ns measure time.

Referring back to FIG. 2, the modulator (e.g., a polar modulator) or the FMOD/FSRC component 240 as a low frequency component of a modulator can operate to receive amplitude and frequency modulation data (AM-Data) and (FMOD-Data) as calculated by a coordinate rotation digital computer component (CORDIC) (not shown) on a 104 MHz clock rate. The data can be interpolated on a modulated DCO clock rate divided by 4, denoted as $f_{DCO/4}$, with a linear fractional sample rate converter FSRC 240 in an FM Path and a quadratic FSRC in an AM-Path, for example. The linear FSRC high-frequency part can be reloaded with the initial frequency value (reload) $f_{reload}$, increment value (inc) $f_{inc}$ and reload cycles from an oscillator. The high-frequency FSRC can be clocked with $f_{DCO/4}$, in which for each rising edge a new frequency word is calculated according to equation (6).

$$f_i = f_{reload} + f_{inc} \cdot i$$ (Eqn. 6).

A reload cycle counter of the FMOD/FSRC component or modulator 240 can be initialized at a reload event with a reload cycle value from an oscillator (e.g., an NCO) and can be decreased with each rising edge of $f_{DCO/4}$. A reload event can be created to generate the set of reload values (reload cycle values, $f_{reload}$ and $f_{inc}$) when a counter to the NCO is initialized, for example.

The coarse time calculation component 228 of FIG. 2 is configured to receive the sign signal 510 or 520 of FIG. 5 and compute the DCO calculation $T_{m\_dco}$ as a function of the sign signal being 510 or 520, a DCO counter value (e.g., n) from the DCO counter 226, and a set of reload values ($f_{reload}$, $f_{inc}$) or modulated frequency values from the FMOD/FSRC component 240. The coarse time calculation component 228 utilizes the sign value to calculate a time of a non-constant/non-equidistant periods of the digital oscillator periods. The DCP periods of the DCO can be equidistant and non-equidistant. The DCO periods, for example, can be non-equidistant from one another when the PLL is used in a polar modulator with a modulation of amplitude and phase. In applying the phase shift in modulation, different frequency words are applied to the DCO by which to change the period. When the periods are changing, such as in FIG. 6 with different periods or non-equidistant periods t1, t2, and t3, for example, each of these are not equivalent, so information related to the length of each is obtained for calculating the Tm_DCO. For example, Eqn. 7 below provides a sum of all the periods, in which 1/f is in the digital domain and thus the additional equations are performed with a Taylor series.

In describing the coarse time calculation component 228, various assumptions can be ascribed for the calculation of $T_{m\_DCO}$. In one embodiment, the reference clock input to the edge selector 222 can be about 26 MHz with negligible or without any offset to the DCO 230 comprising about a 104 MHz digital clock. Therefore, at every 26 MHz rising edge reload values $f_{reload}$ and $f_{inc}$ can be available. Additionally, all digital processing delay offset can be compensated for. The $T_{m\_DCO}$ calculation can thus be done on 26 MHz rising reference clock edge. The coarse time calculation component 228 can therefore generate an output as a propagation count of the differential delay line as a function of a DCO periods of the DCO 230. The coarse time calculation component 228 generates the coarse quantization time of the DCO as a propagation counter of the differential delay line based on the reload values $f_{reload}$ and $f_{inc}$ from low-frequency FSRC side of a frequency modulation and fractional sample rate converter (FMOD/FSRC) component 240, the sign value of edge selector component 222, and the DCO Counter value n. The time $T_{m\_DCO}$ is furthermore a function of a sum of $t_i$ the DCO periods divided by the by four divisor 232, which can be represented as $1/f_i$. The FSRC component calculates the DCO frequencies $f_i$ with 1 GHz clock rate, while calculating the inversion of $f_i$ leads to a huge current consumption in digital part. Therefore a tertiary or third ordered Taylor series approximation can be used to implement the inversion, as in the equation (10) below, in which the following summations: $\Sigma_1^n i$, $\Sigma_1^n i^2$, and $\Sigma_1^n i^3$ can be replaced by a closed form of equation 10 below.

Figure 7:
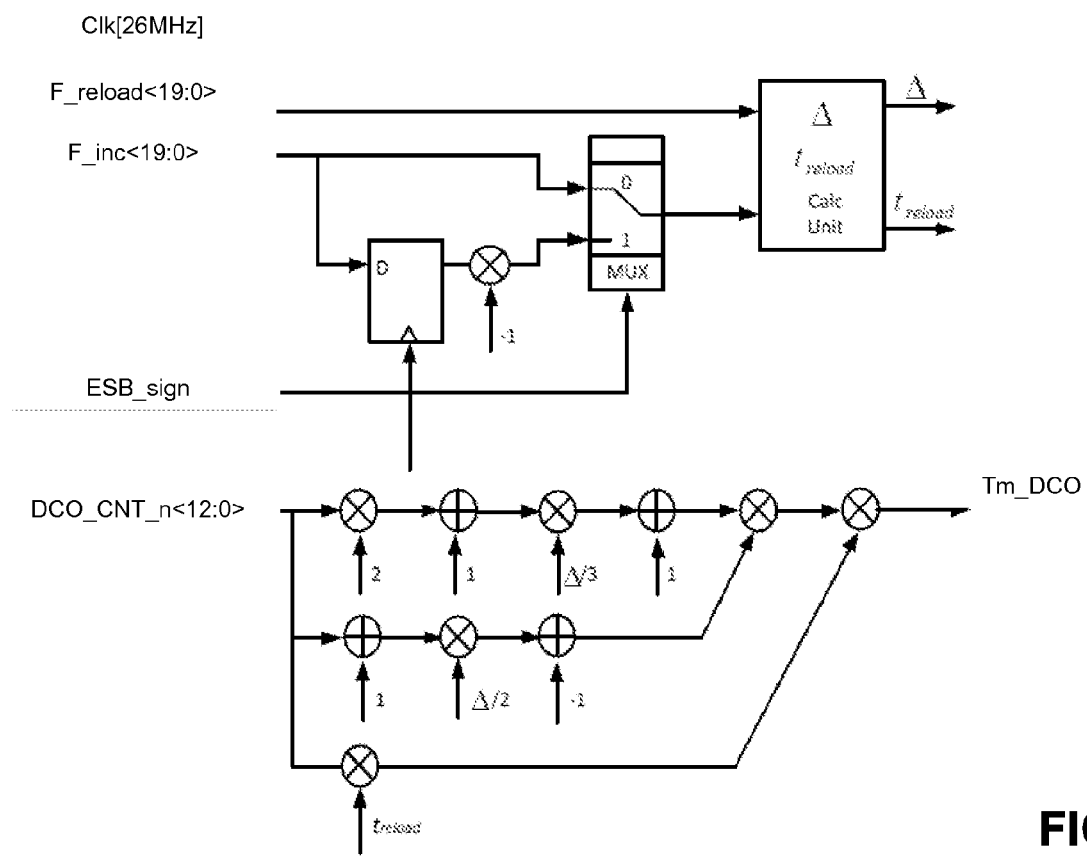
FIG. 7 illustrates an example of the coarse time calculation component of the TDC in accordance with various aspects described.

Referring now to FIG. 7, illustrated is an example of a coarse time calculation component 228 comprising a mux, multipliers and adders running at a 26 MHz reference clock. In one aspect, a Horner schema enables a digital implementation of $T_{m\_DCO}$ calculation component 228 with only 6 multipliers and 5 adders running at the 26 MHz reference clock. A sign bit equal to one indicates that a divider edge such as a Multi Modulus Divider edge appears before reference clock edge; therefore $f_{inc}$ from a previous reload is used and multiplied by −1. The DCO_CNT corresponds to the counter value, ESB sign corresponds to the sign value from the edge selector 222, while F_reload and F_inc designate frequency signal values from a low frequency part of a frequency modulator (e.g., Fractional Sample Rate Converter), which are modulated and used to determine the coarse time measurement (Tm_DCO).

$$t_{m\_DCO} = \sum_1^n t_i = \sum_1^n \frac{1}{f_i} = \frac{1}{f_{reload}} \sum_1^n \frac{1}{1 + \frac{f_{inc}}{f_{reload}} i}. \quad (\text{Eqn. 7})$$

$$t_{reload} = \frac{1}{f_{reload}}. \quad (\text{Eqn. 8})$$

$$\Delta = \frac{f_{inc}}{f_{reload}} \quad (\text{Eqn. 9})$$

$$t_{m\_DCO} = t_{reload} \cdot \sum_1^n \frac{1}{1 + i \cdot \Delta} =$$

$$t_{reload} \cdot \sum_1^n 1 + i \cdot \Delta + i^2 \cdot \Delta^2 - i^3 \cdot \Delta^3$$

$$t_{m\_DCO} = t_{reload}\left(n - \Delta \sum_1^n i + \Delta^2 \sum_1^n i^2\right)$$

$$t_{m\_DCO} = t_{reload} \cdot \left(n - \Delta \frac{n \cdot (n+1)}{2} + \Delta^2 \cdot \frac{n \cdot (n+1) \cdot (2n+1)}{6}\right) \quad (\text{Eqn. 10})$$

$$t_{m\_DCO} = t_{reload} \cdot n \cdot \left(1 - \Delta \frac{n+1}{2} \cdot \left(1 + \Delta \frac{2n+1}{3}\right)\right).$$

In another aspect, the coarse time calculation component 228 of the TDC 200 is configured to compute up to 90 degrees of 360 degrees because in one 26 MHz period the FSRC is able to be reloaded (e.g., reload values) four times as the FMOD/FSRC component 240 receives data from a CORDIC on a 104 MHz clock rate. Other implementations can also be envisioned according to different clock rates, for example.

The coarse time calculation component 228, for example, compares the DCO counter value (n, or DCO_CNT_n) from the DCO counter 226 with a first set of reload cycle values (e.g., $f_{reload}$, $f_{inc}$). If the DCO counter value (n) is larger than the first reload cycle value (e.g., $f_{reload}$), then the first reload cycle value is used to factor $T_{m\_DCO_1}$. For example, the reload cycle value can be subtracted from the DCO counter value. If the DCO-counter value is larger than a second reload cycle value, then $T_{m\_DCO_2}$ can be factored with the second set of reload cycles and the DCO counter, in which the DCO counter value can be reduced by the second reload cycle value, for example. If the DCO counter value is larger than a third reload cycle value, then the third recycle value can be utilized and the DCO counter value reduced or factored by the third reload value for determining $T_{m\_DCO_3}$ for example. The procedure is then iteratively repeated again. The propagation counter count or a coarse quantization time total $T_{m\_DCO_{TOTAL}}$ can be recursively calculated by the coarse time calculation component, which enables a 360° phase measurement. A delay line length can also be determined by the DCO clock divided by 2/4 depending on the selected band, which leads to frequency range of 700 MHz up to 1500 MHz. Therefore the delay line operates to handle up to about 1 to 5 ns, such as 1.5 ns measure time.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
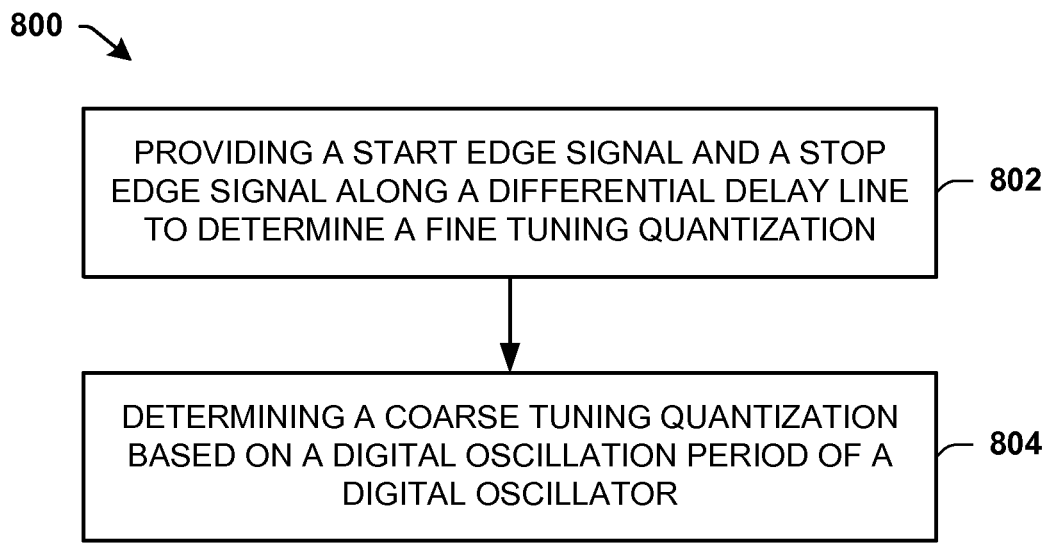
FIG. 8 illustrates an example method in accordance with various aspects described.

Referring to FIG. 8, illustrated is an example method for utilizing a DCO for a coarse time measurement in a TDC in accordance with various aspects described. The method 800 initiates at 802 with providing a start edge signal to a differential delay line to determine a fine tuning quantization or a fine time measurement. The fine tune measurement can be a bipolar measurement that results from a propagation of a start edge from a phase generator (e.g., phase generator 224) along delay chain elements (forming a positive chain) of the differential delay chain and a propagation of a stop edge along delay chain elements (a negative chain) in an opposite direction. The bipolar measurement can be generated in way that cancels any time delay or offset so that the delays chain elements are synchronized without mismatch.

In one embodiment, the start edge and the stop edge can be provided via the phase generator 224 of FIG. 2 without reliance on additional multiplexers being coupled to or in operation with the coarse time quantization measurements of the TDC. For example, the coarse time quantization can be determined as a function of a modulated frequency signal from the low frequency portion of a modulator (e.g., a polar modulator) and the DCO periods of the digital oscillator.

At 804, the method comprises determining a coarse tuning quantization or a coarse time measurement based on digital oscillation period(s) of a digital oscillator, which can be equidistant and also non-equidistant periods. The coarse quantization time can be generated to determine the start and stop final time measurement as a function of the DCO periods and a bipolar time measurement generated from a reference clock input and a divider input.

A latching or a propagating of a start edge along the differential delay line can be controlled as a function of a start signal and a stop signal generated from a reference signal and a divider signal, wherein the divider signal is derived from a start and stop time measurement that is based on the propagation counts of the differential delay line as a function of the DCO periods of the DCO.

Figure 9:
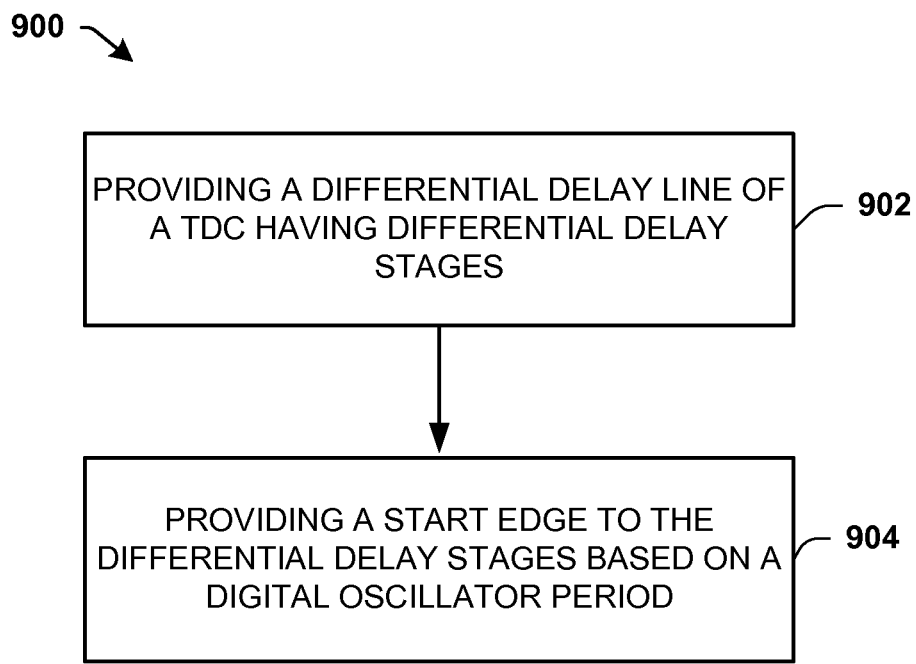
FIG. 9 illustrates a flow diagram of another exemplary method.

Referring to FIG. 9, illustrated is another example method for utilizing a digitally controlled oscillator (DCO) for a coarse time measurement in a TDC in accordance with various aspects described. The method 900 initiates at 902 with providing a differential delay line comprising a plurality of differential delay stages, which include a first delay element and a second delay element.

At 904, a phase generator provides a start edge to the plurality of differential delay stages of the differential delay line as a function of a DCO counter value generated by a DCO counter.

A coarse time calculation component (e.g., 228) is configured to determine a coarse time measurement based on equidistant DCO periods of a DCO. The coarse time calculation component is configured to receive the DCO counter value from the DCO counter and generate a coarse quantization time of a DCO. The coarse time calculation component is configured to generate a final time measurement as a function of the coarse quantization time, a first binary conversion based on a first plurality of comparators of the differential delay line and a second binary conversion based on a second plurality of comparators of the differential delay line. The coarse time calculation component is further configured to recursively generate a DCO calculation based on the DCO counter value to facilitate a phase measurement, which can be represented along 360 degrees with a set of processing iterations.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a time to digital converter that comprises a delay line comprising a plurality of delay stages that include a first delay chain and a second delay chain to generate a fine time measurement of a digital oscillator of a phase locked loop. A coarse time calculation component is configured to generate a coarse time measurement based on equidistant periods and non-equidistant periods of the digital oscillator of the phase locked loop, wherein the fine time measurement and the coarse time measurement form a phase difference measurement of the phase locked loop that is communicated to the digital oscillator.

Example 2 includes the subject matter of Example 1, further comprising an edge selector configured to enable a bipolar time measurement by generating a start edge, a stop edge and a sign value, wherein the start edge and the stop edge are generated based on a reference signal and a divider signal, and the sign value is generated based on a receiving order of receiving an edge of the reference signal and the divider signal, respectively.

Example 3 includes the subject matter of any of Examples 1 and 2, including or omitting optional elements, wherein the coarse time calculation component is further configured to receive a digital oscillator counter value from a digital oscillator counter and generate the coarse time measurement of the digital oscillator based on the digital oscillator counter value and a modulated digital oscillator frequency from a frequency modulator.

Example 4 includes the subject matter of any of Examples 1-3, including or omitting optional elements, wherein the coarse time calculation component is further configured to provide the coarse time measurement to a summing component to generate a final time measurement as the phase difference, wherein the final time measurement is derived from the coarse time measurement, a first binary conversion based on a first plurality of comparators of the delay line and a second binary conversion based on a second plurality of comparators of the delay line.

Example 5 includes the subject matter of any of Examples 1-4, including or omitting optional elements, wherein the coarse time calculation component is further configured to recursively generate a digital oscillator calculation based on a digital oscillator counter value to generate a final time measurement as a phase measurement, wherein the delay line is configured to generate time measurements corresponding to different polarities for generation of a bipolar time measurement and cancel an offset resulting from at least one of a process, a temperature or a voltage dependency.

Example 6 includes the subject matter of any of Examples 1-5, including or omitting optional elements, wherein the coarse time calculation component is further configured to generate the coarse time measurement based on a set of modulated frequency values from a polar modulator, a digital oscillator counter value and a sign value generated from an edge selector, wherein the coarse time calculation component utilizes the sign value to calculate a time of a non-constant digital oscillator period.

Example 7 includes the subject matter of any of Examples 1-6, including or omitting optional elements, further comprising an edge selector configured to compare a reference signal of a reference clock and a divider signal of a divider clock and generate a start signal and a stop signal to a phase generator based thereon, and further configured to generate a sign value and provide the sign value to the coarse time calculation component, wherein the sign value is generated based on an order of a receiving edge of the reference signal and the divider signal, respectively.

Example 8 includes the subject matter of any of Examples 1-7, including or omitting optional elements, further comprising a first set of comparators and a second set of comparators coupled to the plurality of delay stages configured to control different states of the plurality of delay stages based on a start edge and a stop edge that is provided by the phase generator.

Example 9 includes the subject matter of any of Examples 1-8, including or omitting optional elements, further comprising a digital oscillator counter configured to count the periods of the digital oscillator and provide a count of the periods to the digital oscillator to determine the coarse time measurement.

Example 10 includes the subject matter of any of Examples 1-9, including or omitting optional elements, further comprising a phase generator configured to control propagation and latching of delay line states of first delay elements and second delay elements of the plurality of delay stages based on a conversion of a received start signal and a received stop signal into a start edge and a stop edge that propagate along the plurality of delay stages, wherein the delay line is configured to generate a bipolar time measurement without an intrinsic offset.

Example 11 includes the subject matter of any of Examples 1-10, including or omitting optional elements, wherein the phase generator and the delay line are further configured to cancel the intrinsic offset between processing a reference signal of a reference clock path and a divider signal of a divider clock path as a function of at least two DCO periods and the bipolar time measurement.

Example 12 includes the subject matter of any of Examples 1-11, including or omitting optional elements, wherein the phase generator is configured to inject the start edge to the plurality of delay stages of the delay line without utilizing a multiplexer for edge injection.

Example 13 includes the subject matter of any of Examples 1-12, including or omitting optional elements, wherein the phase generator is configured to control latching of delay line states of first delay elements and second delay elements of the plurality of delay stages as a function of a propagation mode and a latch mode and propagate the start edge and the stop edge in different directions with respect to one another along the delay line to generate the bipolar time measurement.

Example 14 includes the subject matter of any of Examples 1-13, including or omitting optional elements, further comprising an edge selector component configured to generate a bipolar time measurement via the delay line based on a reference clock input of a reference clock path and a divider clock input of a divider clock path.

Example 15 is a mobile device comprising an antenna port, an RF-frontend, a digital baseband processor, and a digital phase locked loop in at least one of the RF-frontend and the digital baseband processor comprising a time to digital converter and a digital oscillator. The time to digital converter comprises a delay line comprising a plurality of delay stages that include a first delay element chain and a second delay element chain to generate a fine time measurement. A coarse time calculation component is configured to generate a coarse time quantization based on digital oscillator periods of the digital oscillator.

Example 16 includes the subject matter of Example 15, wherein the coarse time calculation component is further configured to generate the coarse time quantization based on the digital oscillator periods and a set of modulated frequency values of a frequency modulator.

Example 17 includes the subject matter of any of Examples 15 and 16, including or omitting optional elements, wherein the coarse time calculation component is further configured to provide the coarse time quantization to an adder to generate a final time measurement with a first binary conversion of a first state of first delay elements of the delay line and a second binary conversion of a second state of second delay elements of the delay line.

Example 18 includes the subject matter of any of Examples 15-17, including or omitting optional elements, further comprising a phase generator configured to provide a start edge and a stop edge to the plurality of delay stages of the delay line to generate the fine time quantization as a bipolar measurement via the delay line based on a received start signal and a received stop signal.

Example 19 includes the subject matter of any of Examples 15-17, including or omitting optional elements, further comprising a phase generator configured to generate at least two timing measurements via the plurality of delay stages of the delay line based on a DCO rising edge or a DCO falling edge, and based on a start signal or a stop signal.

Example 20 includes the subject matter of any of Examples 15-19, including or omitting optional elements, wherein the phase generator generates the at least two timing measurements as bipolar measurements that propagate via the delay line in opposite directions to one another based on the start signal and the stop signal.

Example 21 includes the subject matter of any of Examples 15-20, including or omitting optional elements, further comprising an edge selector configured to generate a start signal and a stop signal based on a reference signal and a divider signal, and a sign value based on an order of receiving the reference signal and the divider signal.

Example 22 includes the subject matter of any of Examples 15-21, including or omitting optional elements, wherein the coarse time calculation component is configured to generate the coarse time quantization based on at least one of a set of frequency values of a frequency modulator, a digital oscillator counter value and a sign value, wherein the coarse time calculation component utilizes the sign value to calculate a time of a non-constant digital oscillator period.

Example 23 is a method comprising providing a start edge signal and a stop edge signal to a single delay line to determine a fine tuning quantization and determining a coarse tuning quantization based on digital oscillator periods of a digital oscillator of a phase locked loop.

Example 24 includes the subject matter of Example 23, further comprising generating the coarse tuning quantization as a function of the digital oscillator periods, a set of modulated frequency values, a digital oscillator counter value and a sign value, wherein the sign value is determined based on a reception order of a divider signal and a reference signal at an edge selector.

Example 25 includes the subject matter of any of Examples 23 and 24, further comprising latching or propagating of a start edge along the single delay line as a function of a start signal and a stop signal generated at an edge selector from a reference signal and a divider signal.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated mobile or personal computing devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short-or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A time to digital converter comprising:
   a delay line comprising a plurality of delay stages that include a first delay chain and a second delay chain to generate a fine time measurement of a digital oscillator of a phase locked loop;
   a coarse time calculation component configured to generate a coarse time measurement based on equidistant periods and non-equidistant periods of the digital oscillator of the phase locked loop, wherein the fine time measurement and the coarse time measurement form a phase difference measurement of the phase locked loop that is communicated to the digital oscillator; and
   an edge selector configured to compare a reference signal of a reference clock and a divider signal of a divider clock and generate a start signal and a stop signal to a phase generator based thereon, and further configured to generate a sign value and provide the sign value to the coarse time calculation component, wherein the sign value is generated based on an order of a receiving edge of the reference signal and the divider signal, respectively.

2. The time to digital converter of claim 1, wherein the edge selector is coupled to the delay line and the coarse time calculation component and is further configured to enable a bipolar time measurement by generating a start edge and a stop edge to the phase generator, and provide the sign value to the coarse time calculation component, wherein the start edge and the stop edge are generated based on the reference signal and the divider signal, and the sign value is generated based on the order of receiving the receiving edge of the reference signal and the divider signal, respectively.

3. The time to digital converter of claim 1, wherein the coarse time calculation component is further configured to receive a digital oscillator counter value from a digital oscillator counter and generate the coarse time measurement of the digital oscillator based on the digital oscillator counter value and a modulated digital oscillator frequency from a frequency modulator.

4. The time to digital converter of claim 1, wherein the coarse time calculation component is further configured to provide the coarse time measurement to a summing component to generate a final time measurement as the phase difference, wherein the final time measurement is derived from the coarse time measurement, a first binary conversion based on a first plurality of comparators of the delay line and a second binary conversion based on a second plurality of comparators of the delay line.

5. The time to digital converter of claim 1, wherein the coarse time calculation component is further configured to recursively generate a digital oscillator calculation based on a digital oscillator counter value to generate a final time measurement as a phase measurement, wherein the delay line is configured to generate time measurements corresponding to different polarities for generation of a bipolar time measurement and cancel an offset resulting from at least one of a process, a temperature or a voltage dependency.

6. The time to digital convert of claim 1, wherein the coarse time calculation component is further configured to generate the coarse time measurement based on the digital oscillator periods and a set of modulated frequency values of a frequency modulator.

7. The time to digital converter of claim 1, further comprising a first set of comparators and a second set of comparators coupled to the plurality of delay stages configured to control different states of the plurality of delay stages based on a start edge and a stop edge that is provided by the phase generator.

8. The time to digital converter of claim 1, further comprising a digital oscillator counter configured to count the periods of the digital oscillator and provide a count of the periods to the digital oscillator to determine the coarse time measurement.

9. The time to digital converter of claim 1, wherein the edge selector component is configured to generate a bipolar time measurement via the delay line based on a reference clock input of a reference clock path and a divider clock input of a divider clock path.

10. A time to digital converter comprising:
a delay line comprising a plurality of delay stages that include a first delay chain and a second delay chain to generate a fine time measurement of a digital oscillator of a phase locked loop; and
a coarse time calculation component configured to generate a coarse time measurement based on equidistant periods and non-equidistant periods of the digital oscillator of the phase locked loop, wherein the fine time measurement and the coarse time measurement form a phase difference measurement of the phase locked loop that is communicated to the digital oscillator;
wherein the coarse time calculation component is further configured to generate the coarse time measurement based on a set of modulated frequency values from a polar modulator, a digital oscillator counter value and a sign value generated from an edge selector, wherein the coarse time calculation component utilizes the sign value to calculate a time of a non-equidistant digital oscillator period.

11. A time to digital converter comprising:
a delay line comprising a plurality of delay stages that include a first delay chain and a second delay chain to generate a fine time measurement of a digital oscillator of a phase locked loop;
a coarse time calculation component configured to generate a coarse time measurement based on equidistant periods and non-equidistant periods of the digital oscillator of the phase locked loop, wherein the fine time measurement and the coarse time measurement form a phase difference measurement of the phase locked loop that is communicated to the digital oscillator; and
a phase generator configured to control propagation and latching of delay line states of first delay elements and second delay elements of the plurality of delay stages based on a conversion of a received start signal and a received stop signal into a start edge and a stop edge that propagate along the plurality of delay stages, wherein the delay line is configured to generate a bipolar time measurement without an intrinsic offset.

12. The time to digital converter of claim 11, wherein the phase generator and the delay line are further configured to cancel the intrinsic offset between processing the reference signal of a reference clock path and the divider signal of a divider clock path as a function of at least two digital oscillator periods and the bipolar time measurement.

13. The time to digital converter of claim 11, wherein the phase generator is configured to inject the start edge to the plurality of delay stages of the delay line without utilizing a multiplexer for edge injection.

14. The time to digital converter of claim 11, wherein the phase generator is configured to control latching of delay line states of first delay elements and second delay elements of the plurality of delay stages as a function of a propagation mode and a latch mode and propagate the start edge and the stop edge in different directions with respect to one another along the delay line to generate the bipolar time measurement.

15. A mobile device comprising:
an antenna port;
an RF-frontend coupled to the antenna port; and
a digital baseband processor coupled to the RF-frontend;
wherein the RF-frontend comprises:
a digital phase locked loop including a time to digital converter coupled to a digital oscillator, wherein the time to digital converter comprises a delay line comprising a plurality of delay stages that include a first delay element chain and a second delay element chain to generate a fine time measurement; and
a coarse time calculation component, coupled to the delay line and the digital oscillator, configured to generate a coarse time quantization based on digital oscillator periods of the digital oscillator, wherein the coarse time calculation component is configured to generate the coarse time quantization based on a set of frequency values of a frequency modulator, a digital oscillator counter value and a sign value, wherein the coarse time calculation component utilizes the sign value to calculate a time of a non-equidistant digital oscillator period.

16. The mobile device of claim 15, wherein the coarse time calculation component is further configured to provide the coarse time quantization to an adder to generate a final time measurement with a first binary conversion of a first state of first delay elements of the delay line and a second binary conversion of a second state of second delay elements of the delay line.

17. The mobile device of claim 15, further comprising:
a phase generator configured to provide a start edge and a stop edge to the plurality of delay stages of the delay line to generate the fine time measurement as a bipolar measurement via the delay line based on a received start signal and a received stop signal.

18. The mobile device of claim 15, further comprising:
a phase generator configured to generate at least two timing measurements via the plurality of delay stages of the delay line based on a digital oscillator rising edge or a digital oscillator falling edge, and based on a start signal or a stop signal.

19. The mobile device of claim 18, wherein the phase generator generates the at least two timing measurements as bipolar measurements that propagate via the delay line in opposite directions to one another based on the start signal and the stop signal.

20. The mobile device of claim 15, further comprising:
an edge selector configured to generate a start signal and a stop signal based on a reference signal and a divider signal, and the sign value based on an order of receiving the reference signal and the divider signal.

* * * * *